US008872237B2

(12) United States Patent
Vanhoucke et al.

(10) Patent No.: US 8,872,237 B2
(45) Date of Patent: Oct. 28, 2014

(54) HETEROJUNCTION BIPOLAR TRANSISTOR MANUFACTURING METHOD AND INTEGRATED CIRCUIT COMPRISING A HETEROJUNCTION BIPOLAR TRANSISTOR

(75) Inventors: Tony Vanhoucke, Bierbeek (BE);
Johannes Josephus Theodorus Marinus Donkers, Valkenswaard (NL);
Hans Mertens, Leuven (BE); Blandine Duriez, Brussels (BE); Evelyne Gridelet, Omal (BE)

(73) Assignee: NXP, B.V., Eindhoven (NL)

( * ) Notice: Subject to any disclaimer, the term of this patent is extended or adjusted under 35 U.S.C. 154(b) by 117 days.

(21) Appl. No.: 13/299,755

(22) Filed: Nov. 18, 2011

(65) Prior Publication Data
US 2012/0132961 A1    May 31, 2012

(30) Foreign Application Priority Data
Nov. 26, 2010  (EP) ..................... 10192804

(51) Int. Cl.
*H01L 29/66* (2006.01)
*H01L 29/737* (2006.01)
*H01L 29/08* (2006.01)

(52) U.S. Cl.
CPC ........ *H01L 29/0821* (2013.01); *H01L 29/7378* (2013.01); *H01L 29/66242* (2013.01)
USPC ............................ 257/197; 438/189; 438/191

(58) Field of Classification Search
USPC .................................. 257/197; 438/189, 191
See application file for complete search history.

(56) References Cited

U.S. PATENT DOCUMENTS

| 5,504,018 | A | 4/1996 | Sato | |
| 5,637,911 | A | 6/1997 | Yamazaki | |
| 6,846,710 | B2 * | 1/2005 | Yi et al. | 438/202 |
| 6,858,485 | B2 * | 2/2005 | Freeman et al. | 438/202 |
| 7,074,685 | B2 | 7/2006 | Magnee | |
| 7,091,578 | B2 * | 8/2006 | Park | 257/591 |
| 7,368,361 | B2 | 5/2008 | Park | |
| 7,816,763 | B2 | 10/2010 | Kim | |
| 2005/0191818 | A1 | 9/2005 | Marty et al. | |
| 2006/0011943 | A1 | 1/2006 | Howard | |
| 2010/0025808 | A1 * | 2/2010 | Donkers et al. | 257/526 |
| 2012/0037914 | A1 * | 2/2012 | Vanhoucke et al. | 257/65 |
| 2012/0168908 | A1 | 7/2012 | Vanhoucke et al. | |

FOREIGN PATENT DOCUMENTS

| CN | 1627530 A | 6/2005 |
| CN | 101211967 A | 7/2008 |
| JP | 61 127169 A | 6/1986 |

OTHER PUBLICATIONS

Knoll, D. et al. "A Flexible, Low-Cost, High Performance SiGe:C BiCMOS Process with a One-Mask HBT Module" IEEE Electron Devices Mgt., IEDM '02 Digest Int'l, pp. 783-786 (2002).

(Continued)

*Primary Examiner* — Nicholas Tobergte

(57) ABSTRACT

Disclosed is a method of manufacturing a heterojunction bipolar transistor comprising a substrate, an upper region of said substrate comprising an active region of the bipolar transistor bordered by shallow trench insulation, said active region comprising a buried collector region extending to a depth beyond the depth of the shallow trench insulation, the method comprising forming a trench in the substrate adjacent to said active region, said trench extending through the shallow trench insulation; at least partially filling said trench with an impurity; and forming a collector sinker in the substrate by developing said impurity to extend into the substrate to a depth beyond the depth of the shallow trench insulation. An IC comprising a heterojunction bipolar transistor manufactured by this method is also disclosed.

5 Claims, 15 Drawing Sheets

(56) References Cited

OTHER PUBLICATIONS

Figure 1:
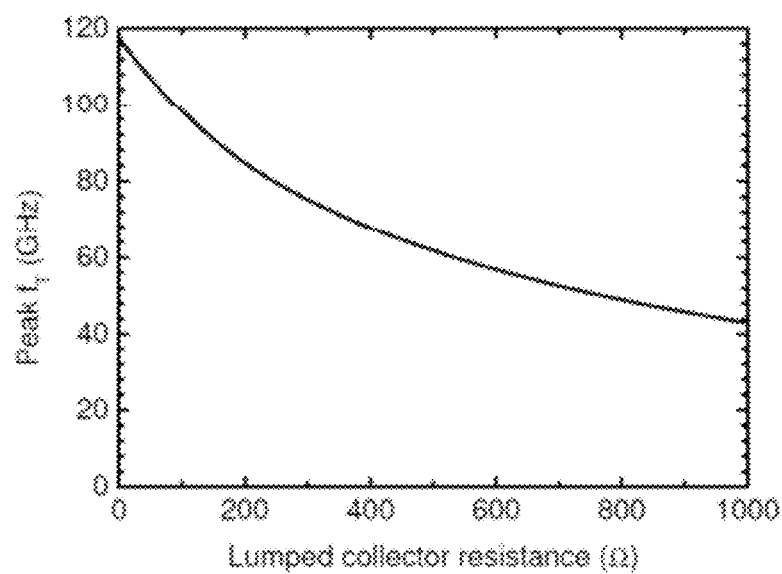

Knoll, D. et al. "A Low-Cost, High-Performance, High-Voltage Complementary BiCMOS Process", IEEE Electron Devices Mgt., IEDM '06 Int'l, 4 pgs. (Dec. 2006).

Extended European Search Report for Patent Appln. No. 10192804.2 (Apr. 15, 2011).

Office Action from China Counterpart application No. 20110375510.3 (Jan. 13, 2014).

* cited by examiner

HETEROJUNCTION BIPOLAR TRANSISTOR MANUFACTURING METHOD AND INTEGRATED CIRCUIT COMPRISING A HETEROJUNCTION BIPOLAR TRANSISTOR

This application claims the priority under 35 U.S.C. §119 of European patent application no. 10192804.2, filed on Nov. 26, 2010, the contents of which are incorporated by reference herein.

FIELD OF THE INVENTION

The present invention relates to a method of manufacturing a heterojunction bipolar transistor comprising a substrate, an upper region of said substrate comprising an active region of the bipolar transistor bordered by shallow trench insulation, said active region comprising a buried collector region extending to a depth beyond the depth of the shallow trench insulation.

The present invention further relates to an integrated circuit comprising a heterojunction bipolar transistor comprising a substrate, an upper region of said substrate comprising an active region of the bipolar transistor bordered by shallow trench insulation, said active region comprising a buried collector region extending to a depth beyond the depth of the shallow trench insulation.

BACKGROUND OF THE INVENTION

Radio Frequency (RF) and Analog Mixed Signal (AMS) circuits are a major growth sector in the IC industry and a key component in the information society. Silicon bipolar technology has been the dominant RF/AMS-design technology of choice for a long time, as it can be readily combined with CMOS processing steps. Several variants of mixed bipolar/CMOS (BiCMOS) process technologies are known. For instance, the applicant provides a SiGe:C based BiCMOS technology in which a long history of breakthroughs in high performance BiCMOS for micro- and millimeter wave applications has been achieved.

The most advanced of those processes, which is known as the QuBiC process, is based on a 0.25 µm CMOS technology resulting in a good compromise between digital CMOS performance, analog RF bipolar performance and cost.

However, it can be expected that more advanced CMOS nodes will need to become available in application domains such as TV Front End applications. This is not trivial, at least from a cost perspective, as the most advanced CMOS nodes in currently in production are too expensive for e.g. the component business and RF/AMS stand-alone products. Hence, there exists a need for a low-complexity heterojunction bipolar transistor (HBT) based on advanced CMOS nodes.

In order to produce such HBTs in a CMOS process, additional process options are necessary with respect to the standard CMOS, as high RF performance requires more performance than can be achieved in a typical baseline CMOS process. In addition, low-complexity, or low-cost, bipolar add-ons to the baseline process may allow IP reuse of bipolar circuits.

It is known that it is possible to integrate a high performance bipolar transistor ($f_T/f_{MAX}$=130/130 GHz) in a quarter micron baseline CMOS process with a limited number of additional process steps. An example of such integration can for instance be found in U.S. Pat. No. 7,074,685. A performance-limiting factor in a HBT in a baseline CMOS process is the intrinsic resistance of the connection between the collector contact (plug) and the buried or implanted active collector region of the HBT device. To this end, a collector sinker is implemented to provide a preferably low-ohmic electrical path from the active collector region to the collector contact. However, the state of the art collector sinker implementations suffer from two main problems.

Firstly, the collector contact resistance may be too high, which results in low DC/RF performance. For performance in the 50 GHz range, the collector resistance is important but not limiting. However, as the base and collector profiles are optimized for higher $f_T$, collector resistance becomes increasingly critical. Therefore, the tradeoffs with respect to reducing the collector resistance while minimizing process complexity become more significant and challenging. As an example, FIG. 1 demonstrates a 1D TCAD simulation of peak-$f_T$ versus total collector resistance. The 1D simulation was performed for a doping profile that is representative for an implanted collector that contains a selectively implanted collector (SIC) used to locally increase the collector dope and obtain higher RF performance).

Apart from the collector (lateral) sheet resistance determined by the implanted or buried collector region, the connection of the implanted or buried collector towards the contact at the surface, i.e. the sinker, plays an important role in the total collector resistance of the device. The sinker resistance can be the bottleneck for the RF performance and should therefore be as low as possible. For example in low complexity HBT technologies, the collector resistances are of direct importance for the device optimization towards high performance, as is reported by Knoll et al. in "A flexible low-cost high-performance Si:Ge:C BiCMOS process with a one-mask HBT module", Electron Devices Meeting, IEDM 2002, pages 783-786 and in "A low-cost, high-performance, high voltage complementary BiCMOS process, Electron Devices Meeting, IEDM 2006 pages 1-4.

Figure 2:
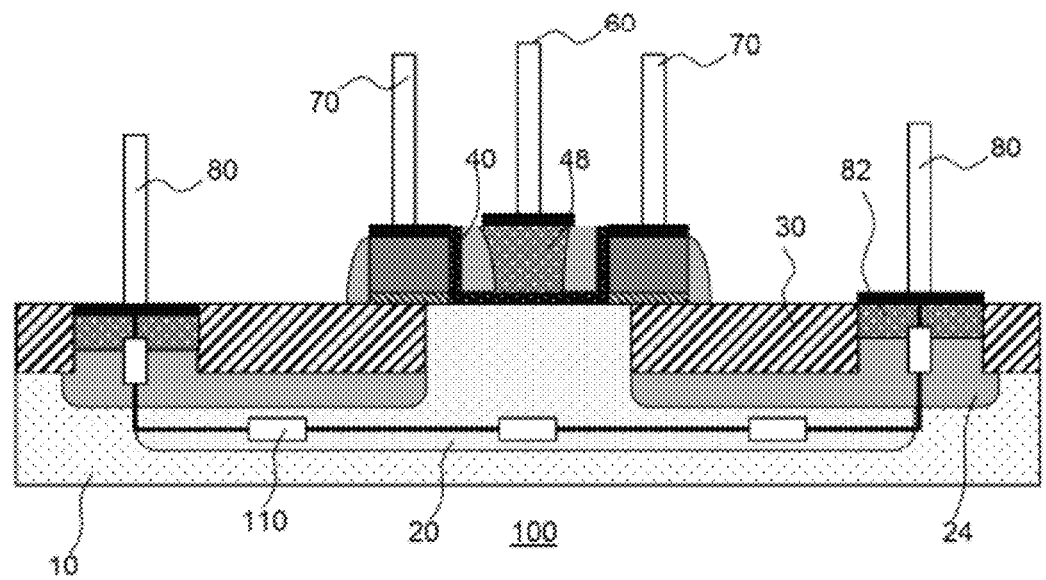

Traditionally the sinker implant conditions are chosen to minimize the resistance for given active area. As an example, a schematic cross-section of a LC-HBT 100 is shown in FIG. 2, which comprises a substrate 10 including an active region 20 in which the collector is formed, a base region 40, emitter region 48 and a collector sinker 82 separated from the active region 20 by shallow trench insulation (STI) 30. The HBT 100 has, by way of non-limiting example, two collector sinkers 82 with collector connections 80. Emitter contact 60 and base contacts 70 are also shown. The resistance of the collector contact, which includes the sinker plug 82 and the further doped region 24, is schematically depicted as series resistance chain 110.

For the conventional approach, a dedicated sinker implant 82 is needed to make optimal use of the thermal budget of the remaining processing steps and permits a proper outdiffusion and good connection between collector region and contact 80.

Figure 3:
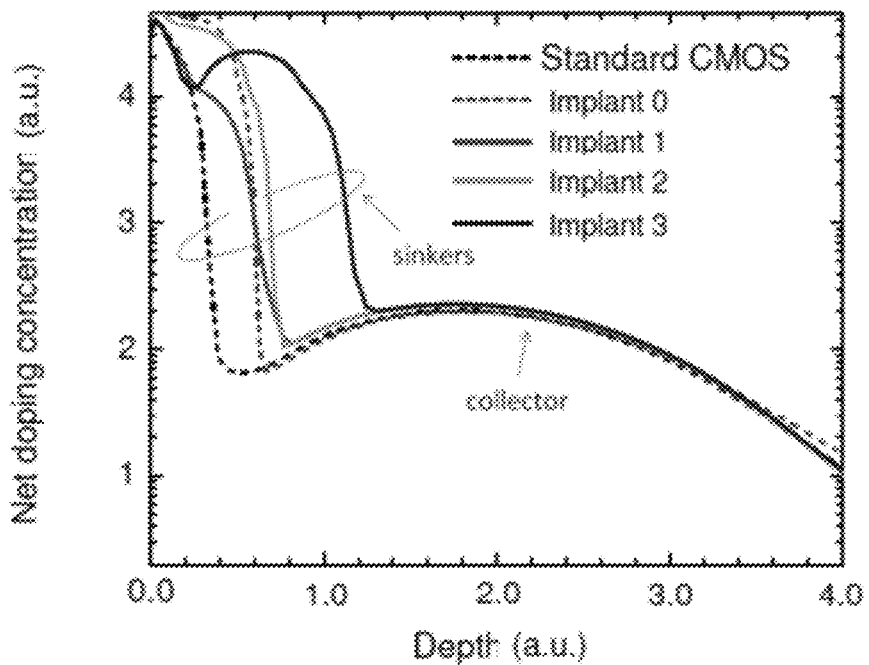

An illustration of several dedicated sinker implants compared to the standard CMOS implants is given in FIG. 3. It will be clear that depending on the sinker implant conditions, the total collector resistance will change. Typically, standard CMOS implants (i.e. Nwell and Nplus) result in a sinker resistance between 100-300 Ω·µm (measured in the length direction of the device), while a dedicated sinker implant yields a resistance between 30-200 Ω·µm depending on the nature of the collector, i.e. buried or implanted. Furthermore, the contribution of the collector resistance to the feedback-loop through the collector-base capacitance is an important factor for high-frequency noise optimization in high-end BCMOS processes.

Despite the decrease in sinker resistance and increase of RF performance for optimal sinker implant conditions, one drawback of the standard approach is the need for an extra sinker mask, which adds to the cost and complexity of the manufacturing process.

Secondly, the collector sinker can have a negative impact on the device breakdown characteristics. The influence of the collector sinker dopant or impurity levels on the device breakdown is demonstrated in FIG. 4. The open-base breakdown voltage, BVCEO, strongly depends on the distance between sinker 82 and active region 20 of the device. By making the distance smaller (i.e. reducing Was shown in FIG. 4), the out-diffusion of the sinker results in a higher effective collector dope and lowers BVCEO.

From these results it is clear that high collector sinker dope to reduce the collector resistance, thereby improving RF performance and reducing noise as discussed previously has the disadvantage of higher active region dope due to sinker diffusion. This diffusion can be compensated by a wider shallow trench insulation 30 which places the sinker further away from the active region but this results in an increase of (total) collector resistance, larger device areas and higher collector-substrate capacitance. Therefore, high sinker doping levels for low resistive path and high RF performance are not always compatible with "high" breakdown voltage and minimum device area.

SUMMARY OF THE INVENTION

The present invention seeks to provide a method of manufacturing a HBT in which the collector resistance may be reduced without reducing the open-base breakdown voltage of the HBT and/or without increasing the complexity of the manufacturing process.

The present invention further seeks to provide a HBT having a reduced collector resistance and an improved open-base breakdown voltage.

In accordance with a first aspect of the present invention, there is provided a method of manufacturing a heterojunction bipolar transistor comprising a substrate, an upper region of said substrate comprising an active region of the bipolar transistor bordered by shallow trench insulation, said active region comprising a buried collector region extending to a depth beyond the depth of the shallow trench insulation, the method comprising forming a trench in the substrate adjacent to said active region, said trench extending through the shallow trench insulation; at least partially filling said trench with an impurity; and forming a collector connection in the substrate by developing said impurity to extend into the substrate to a depth beyond the depth of the shallow trench insulation.

The present invention has been based on the insight that rather than providing an active region in the shallow trench insulation (STI) for implanting the collector sinker plug, a heterojunction bipolar with improved collector and breakdown characteristics can be achieved by etching a trench through the STI and providing the impurity for the collector connection at the bottom of the trench, which has the advantage that the impurity levels can be better controlled whilst facilitating a reduction in the size of the STI portion between the active region (i.e. the transistor region) and the collector connection region, thus reducing collector resistance without negatively affecting the open-base breakdown voltage of the HBT.

In an embodiment, the method further comprises providing a stack comprising a gate oxide layer, a polysilicon layer and a nitride protection layer over the substrate; forming a further trench in the stack exposing the active region; growing an epitaxial layer over the resultant structure; forming said trench; growing spacers in the trench and said further trench; and depositing a doped polysilicon material in between said spacers. In this embodiment, the sinker mask is used to form the trench rather than to implant impurities into an active sinker region in between the STI. This has the advantage that a more effective, i.e. lower resistance collector contact can be formed without adding to the complexity of the manufacturing process; in fact, the complexity of the manufacturing process is reduced because the separate impurity implanting step in the active sinker region is no longer required. Instead, the collector connection impurity may be developed by out-diffusing the impurity in the doped polysilicon material deposited in the trench into the substrate.

The method of the present invention may proceed by, after the deposition of the doped polysilicon material, providing a patterned mask covering the stack, said patterned mask defining a gate region area of the bipolar transistor; removing the exposed regions of the stack to define said gate region; and removing said patterned mask to complete the HBT. By leaving the trench uncovered when removing the exposed regions of the stack to define said gate region, in particular during the removal of the polysilicon layer, the polysilicon in the trench is also partly removed, thereby further reducing the resistance of the collector contact. However, the alternative, i.e. said patterned mask further covering the trench is also feasible.

In another embodiment, the trench and the further trench are simultaneously formed prior to growing the epitaxial layer, and wherein the trench has a width such that at least the bottom of said trench is completely filled by said spacers, the method further comprising removing the doped polysilicon material from the trench; removing the spacers from the trench and the further trench; selectively removing the epitaxial material from the bottom of the trench; and subsequently implanting said impurity. This has the advantage that no additional mask is required to form the trench, as the base window mask to open the active region may be redesigned to include opening the trench, stopping onto the STI, after which an oxide etch step using the same base window mask may be used to selectively remove the STI, thereby completing the formation of the trench. The already available Nplus mask may be redesigned such that an N+ impurity can be implanted into the trench, such that the collector connection may be formed without the need for an additional mask.

To this end, the method may further comprise removing the nitride layer prior to said spacer removal; and protecting the further trench with a mask portion prior to the selective removal of the epitaxial material from the bottom of the trench, said selective removal step further comprising removing the polysilicon layer and the gate oxide layer from the regions uncovered by said mask portion to define the gate structure of the HBT.

In yet another embodiment of the present invention, the method further comprises the additional steps of providing a stack comprising a gate oxide layer, a polysilicon layer and a nitride protection layer over the substrate; forming a further trench in the stack exposing the active region; growing an epitaxial layer over the resultant structure; forming spacers in said further trench over the epitaxial layer; filling the remainder of the further trench with a doped polysilicon material; removing the nitride layer; forming a patterned mask over a region of the resultant structure such that the gate region is covered by the patterned mask; removing the exposed portions of the polysilicon layer and the gate oxide layer of said stack; removing the patterned mask; forming spacers adjacent to the resultant structure on the substrate; and covering the substrate with a further mask leaving exposed a region of the trench, said additional steps being performed prior to the step of forming said trench. Although this embodiment does not reduce the number of processing steps and masks used in the prior art, it does however lead to a collector connection having superior resistance and breakdown characteristics.

In accordance with another aspect of the present invention, there is provided a heterojunction bipolar transistor, comprising a substrate, an upper region of said substrate comprising an active region of the bipolar transistor bordered by shallow trench insulation, said active region comprising a buried collector region extending to a depth beyond the depth of the shallow trench insulation; a trench adjacent to the active region extending through the shallow trench insulation; an outdiffusion of an impurity underneath said trench; and a base window region over said active region, said base window region including a base region and an emitter region separated from the collector region by the base region, said base region having a vertical portion electrically insulated from adjacent contacts by respective spacers.

Such a HBT is particularly suitable for high-frequency applications due to the fact that the collector connection resistance has been reduced without significantly deteriorating open-base breakdown voltage.

Further embodiments and advantages will be apparent from the dependent claims and the following detailed description of the present invention.

BRIEF DESCRIPTION OF THE EMBODIMENTS

Figure 4:
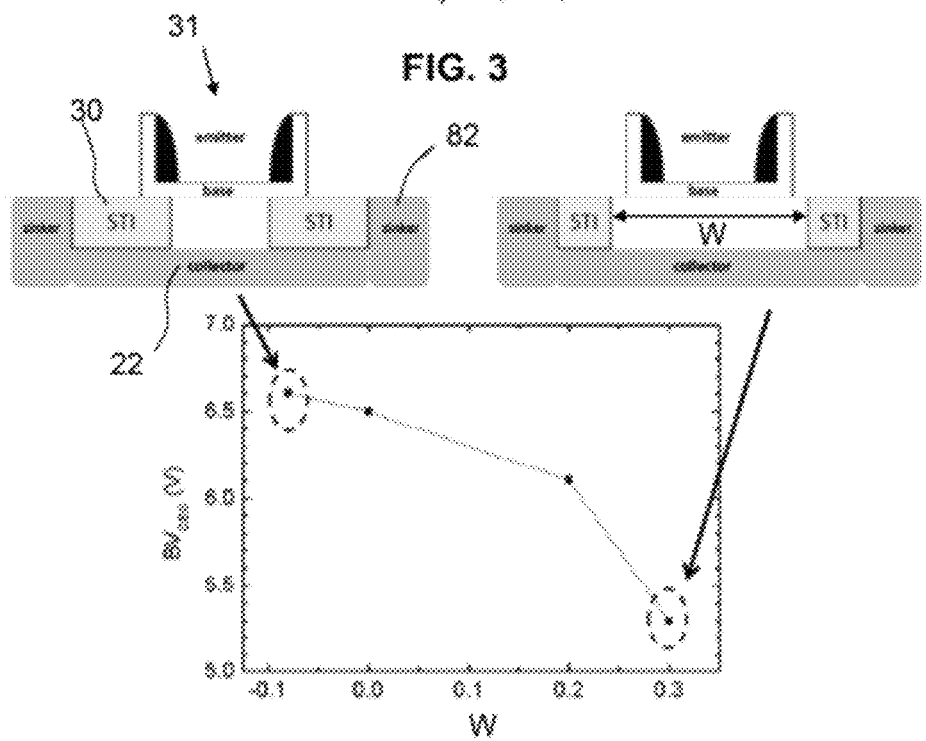
Figure 5:
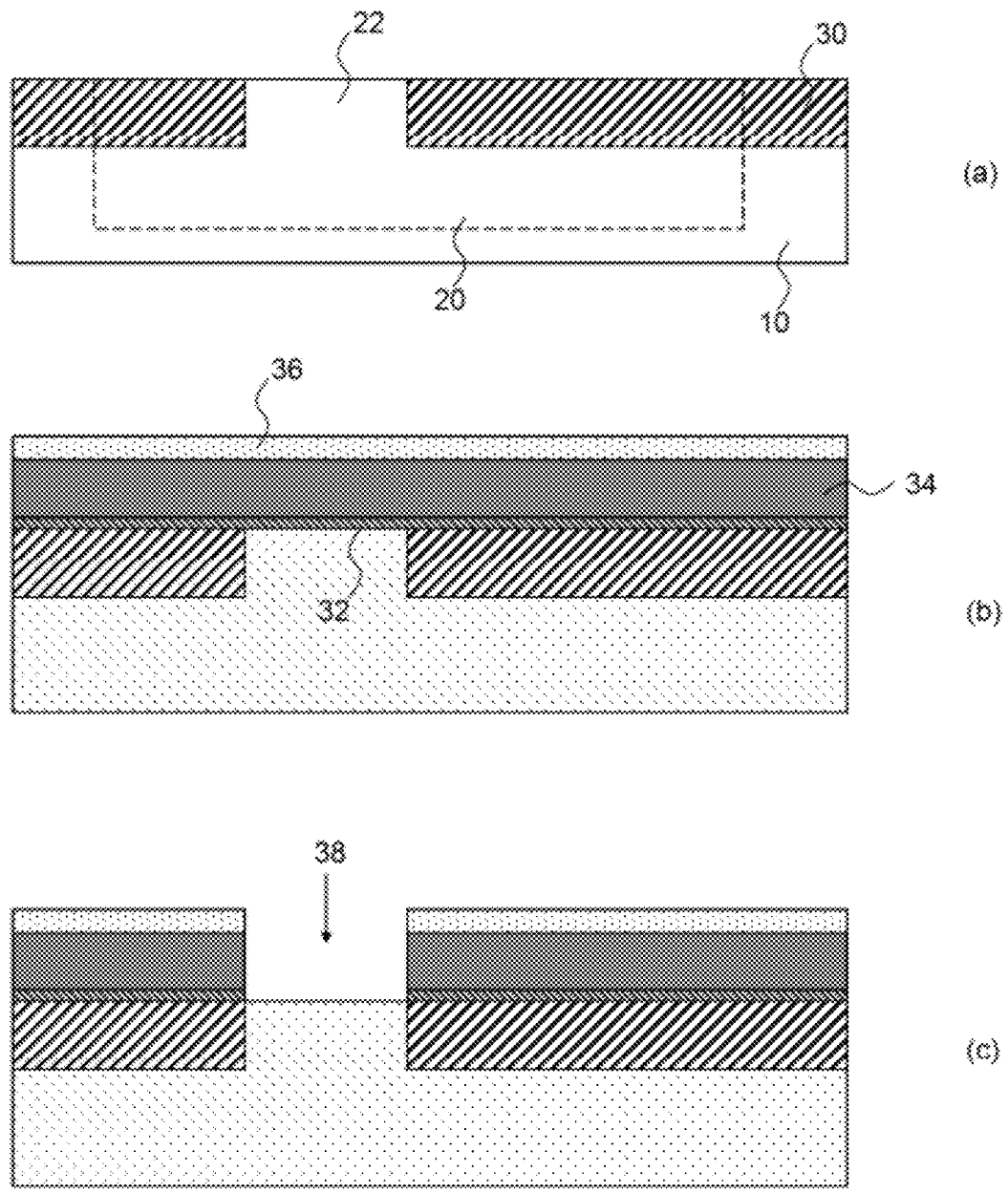
Figure 5:
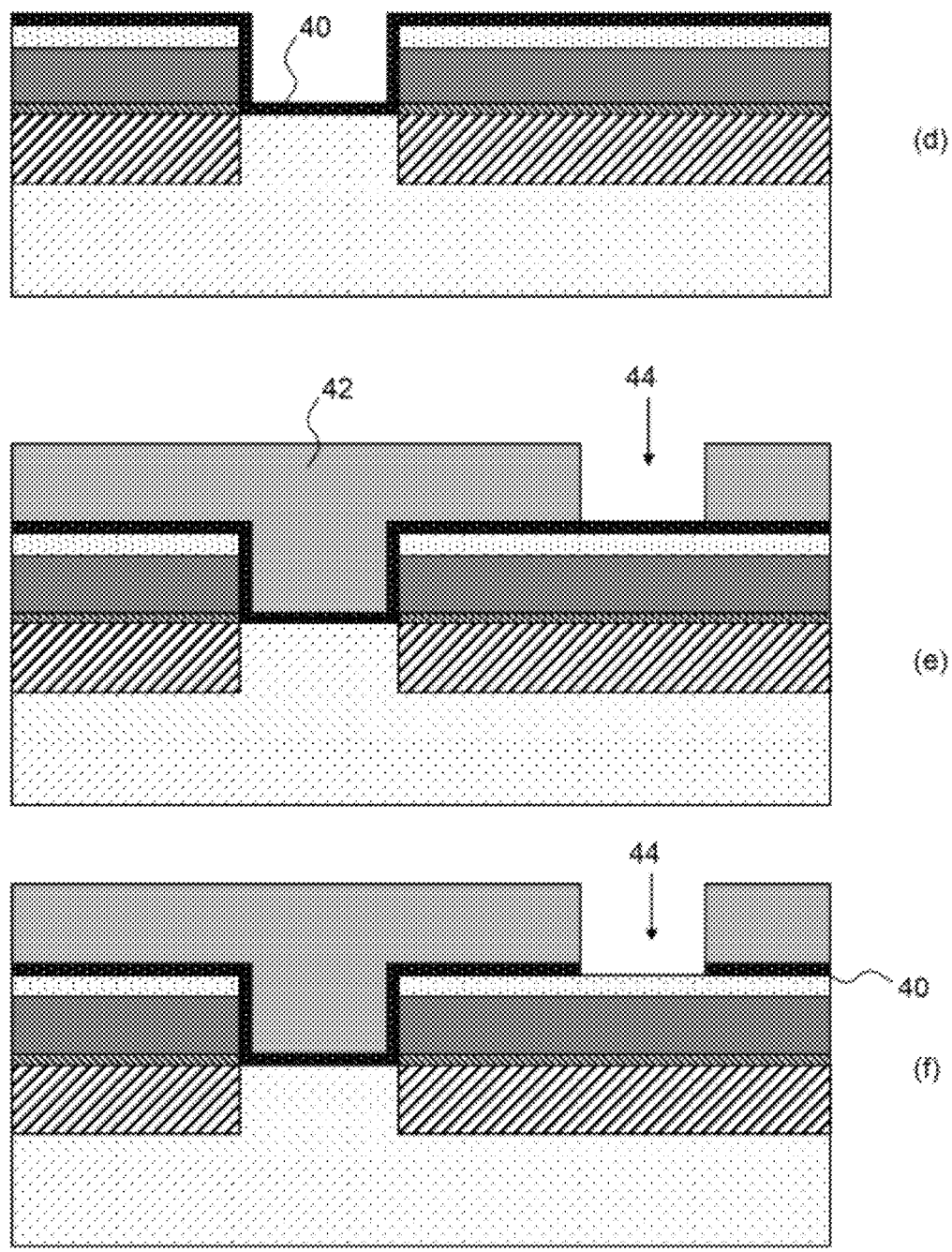
Figure 5:
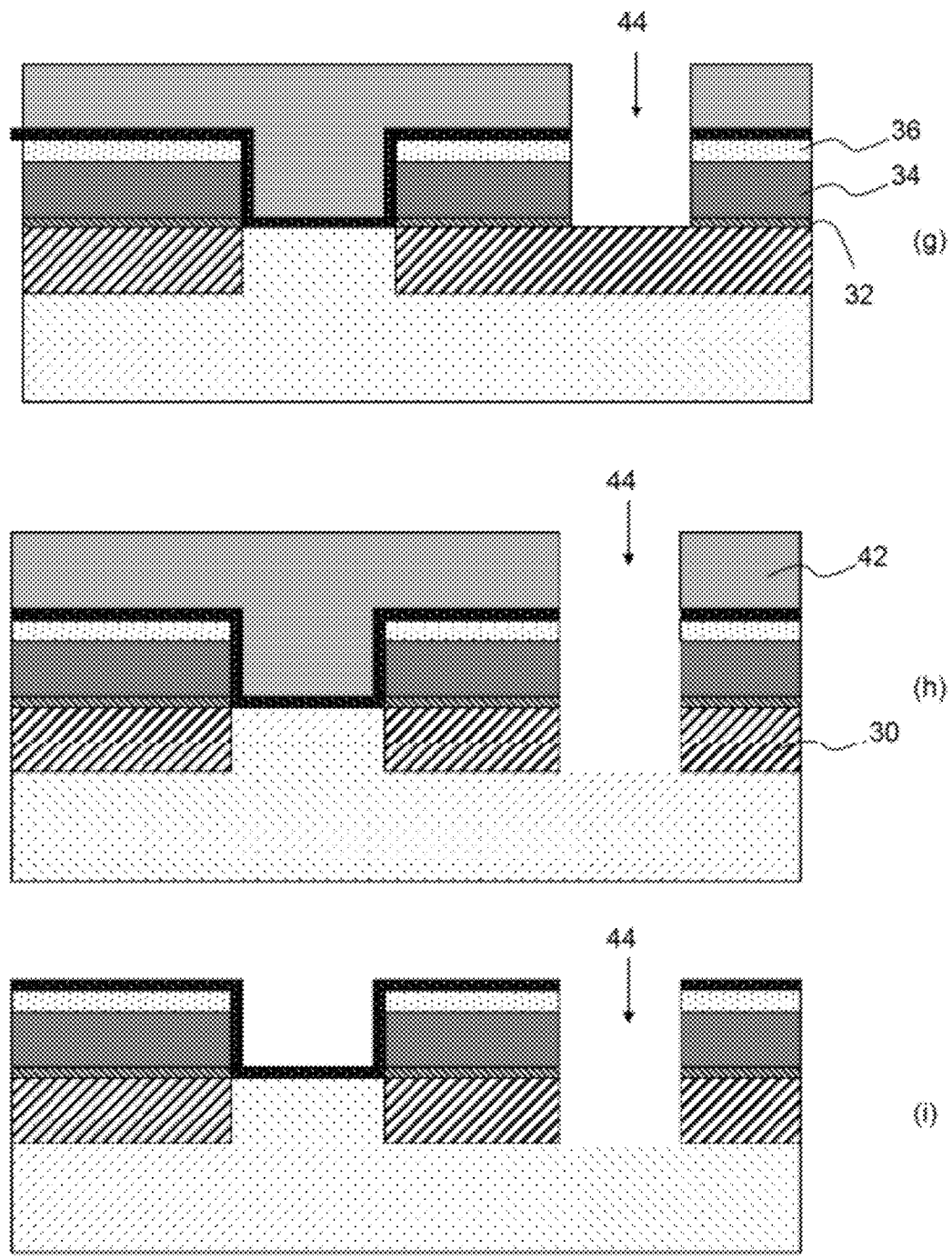
Figure 5:
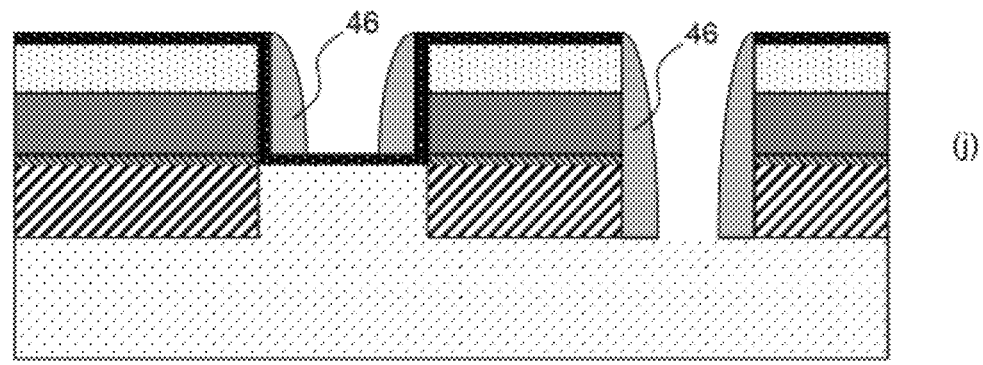
Figure 5:
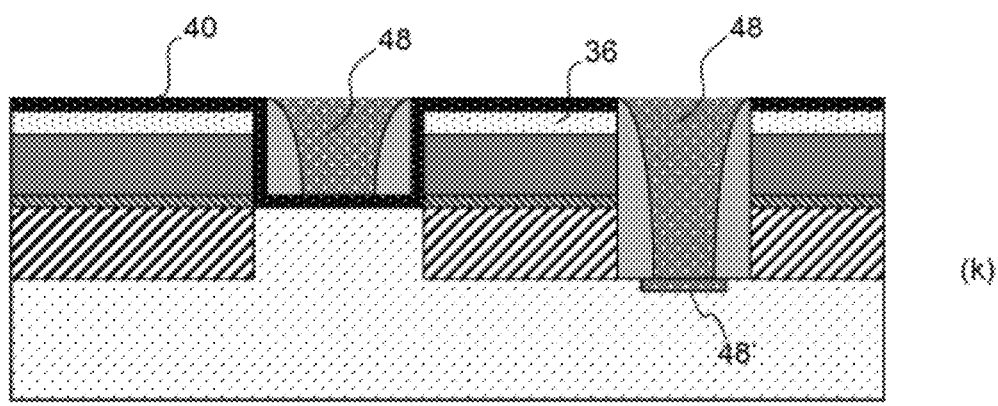
Figure 5:
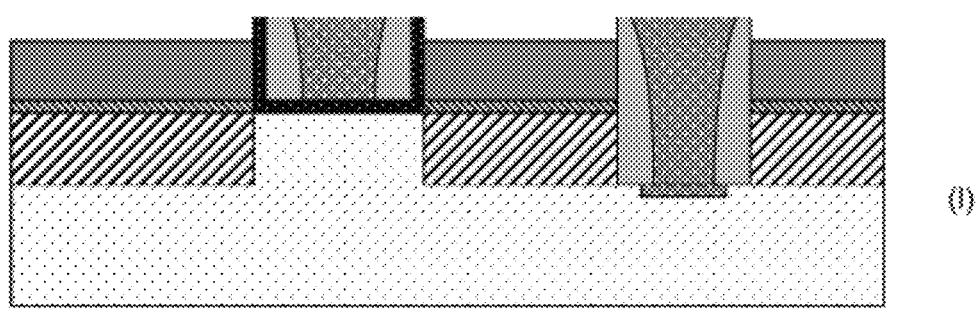
Figure 5:
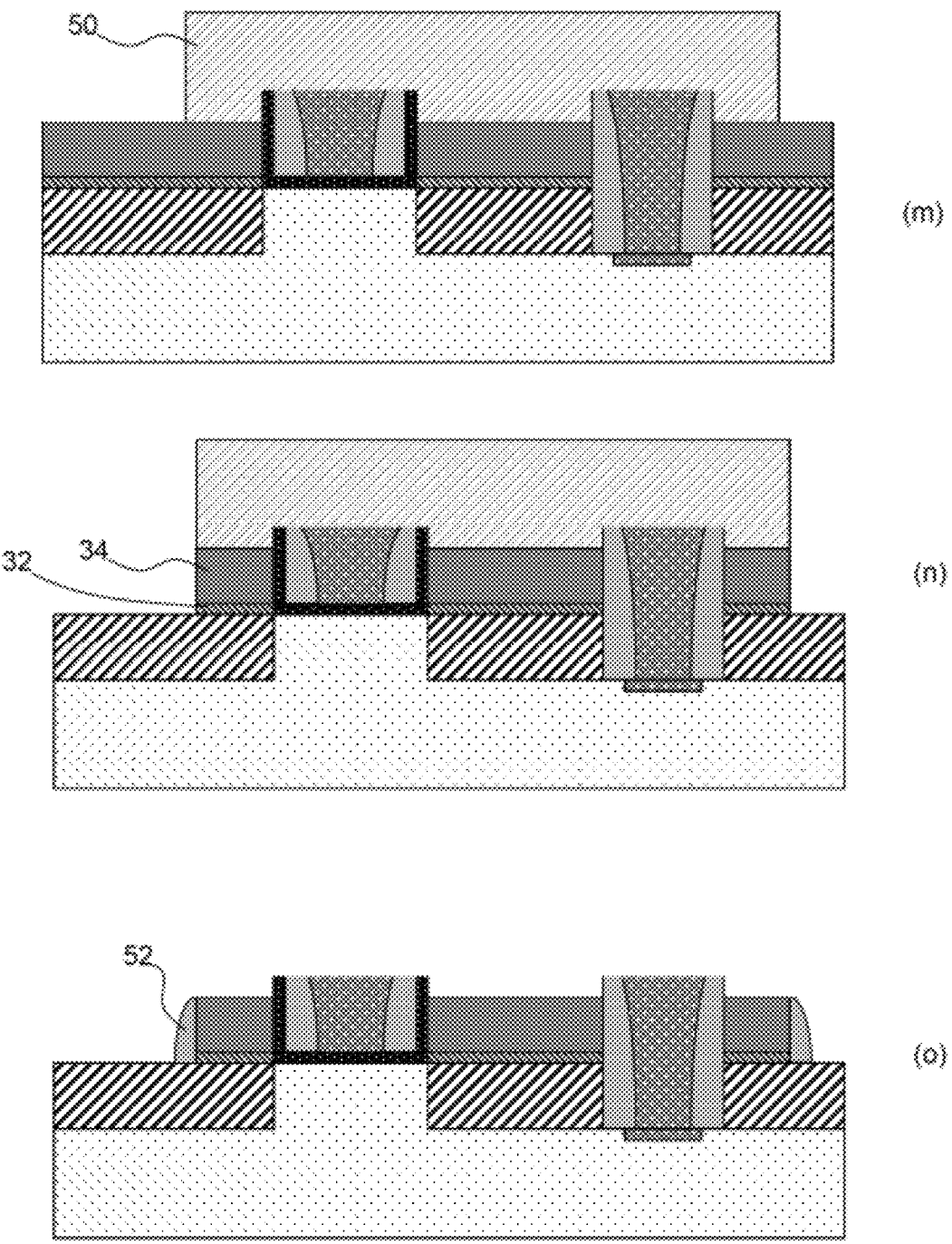
Figure 5:
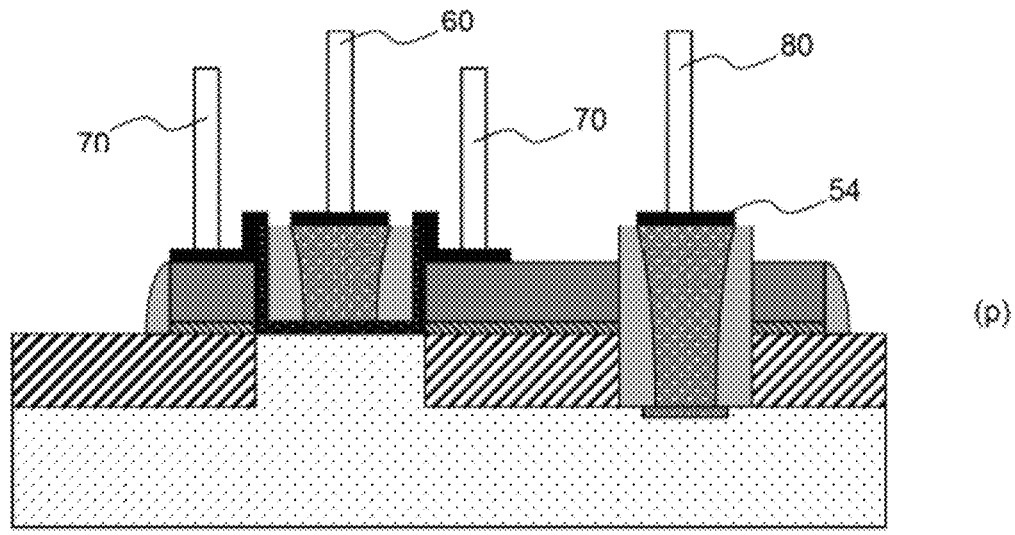
Figure 6:
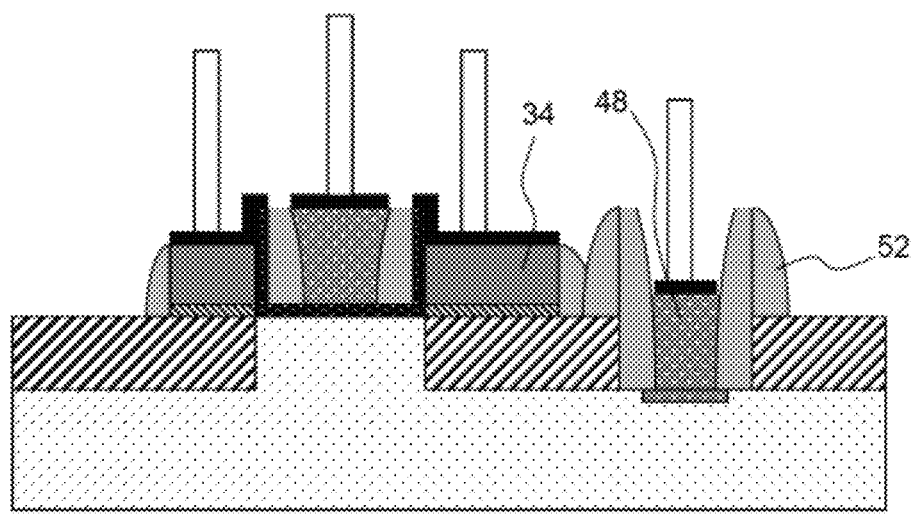

Embodiments of the invention are described in more detail and by way of non-limiting examples with reference to the accompanying drawings, wherein:

FIG. 1 depicts the result of a 1D TCAD simulation of peak-$f_T$ versus total collector resistance of a HBT;

FIG. 2 schematically depicts a prior art HBT;

FIG. 3 schematically depicts a number of doping profiles for a collector sinker plug of a HBT;

FIG. 4 schematically depicts the effect of active region width variation on the breakdown voltage of a HBT;

FIG. 5a-p schematically depicts the steps of a method of manufacturing a HBT in accordance with an embodiment of the present invention;

FIG. 6 schematically depicts a HBT obtained with a variation to the method schematically depicted in FIG. 5a-p;

FIG. 7a-j schematically depicts the steps of a method of manufacturing a HBT in accordance with another embodiment of the present invention; and FIG. 8a-i schematically depicts the steps of a method of manufacturing a HBT in accordance with yet another embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 5 shows a first embodiment of the method of the present invention. In step (a), a substrate 10 is provided in which an active region 20, i.e. a transistor region, is formed. The substrate 10 may be any suitable substrate, such as a silicon substrate, a SiGe substrate and so on. The active region 20 typically comprises a collector region (not shown), which may be formed in any suitable manner, e.g. by the formation of an epitaxial layer in the substrate 10 or by implantation. Access to the active region is provided by the active window 22, which is bordered by shallow trench insulation (STI) 30. The formation of STI 30 in a substrate 10 is well-known and is not further explained for the sake of brevity. It is noted that the STI pattern does not provide a further active region for the collector sinker contact plug, contrary to e.g. the HBT 100 shown in FIG. 2.

In step (b), the gate oxide 32 is grown, followed by the deposition of the gate poly 34 and a nitride protection layer 36. Again, the formation of such layers is well-known and may be achieved in any suitable manner. The layer stack formed in step (b) is opened in step (c) to form the base window by means of a base window etch to expose the active region 20. In an embodiment, the base window etch is performed using the gate oxide layer 32 as an etch step layer, followed by the removal of the gate oxide in the trench 38 formed by the base window etch, thereby forming the base window over the active window 22.

In step (d), a base layer 40 is epitaxially grown over the resultant structure. The base layer 40 may comprise a plurality of sub-layers. In a preferred embodiment, the base layer 40 comprises a SiGe:C epitaxial layer stack, which for instance has the advantage of preventing the outdiffusion of boron impurities from the base layer material, as is known per se.

Steps (a)-(d) are conventional HBT manufacturing steps. Now, in accordance with an embodiment of the present invention, after the formation of the base layer 40, the active window 22 is protected by a resist 42, which is patterned to leave exposed a region of the base layer 40 adjacent to the active window 22 as indicated by the trench 44. Next, the sinker mask, which in the conventional approach is used to implant an impurity in a further active region in between STI regions 30 as shown in FIG. 2, is used to etch away the base layer 40 from inside the trench 44, which is followed by an etch of the nitride layer 36, the gate poly layer 34, the gate oxide layer 32 and an STI oxide 30 to expose the substrate 10 at the bottom of the trench 44, as shown in steps (f), (g) and (h).

The resist 42 is subsequently removed as shown in step (i), after which insulating spacers 46 are formed in trenches 38 and 44 in a known manner. The insulating spacers may for instance be oxide spacers. It is noted that because the collector sinker is now to be formed in a trench through STI 30 rather than by implantation into an exposed portion of the substrate 10 at the upper level, i.e. surface, of the STI 30, the sinker trench 44 also comprises the sidewall spacers 46.

Following the formation of the sidewall spacers 46, a doped polysilicon 48 is formed in the emitter trench 38 and the sinker trench 44 respectively as shown in step (k). Subsequent thermal budgets to develop the doped polysilicon 48 will cause the outdiffusion of the impurity in the polysilicon 48 inside the sinker trench 44 into the substrate 10, thereby forming an impurity region 48' that extends beyond the depth (height) of the STI region 30. It is noted that such thermal budgets may be applied at any suitable time, i.e. it is not necessary to apply such a budget or annealing step immediately after the deposition of the polysilicon 48. It will be apparent when comparing the location of the impurity region 48' with the location of the implant 82 in FIG. 2 that the outdiffusion of an impurity from the bottom of the trench 44 into the substrate 10 reduces the distance between the collector connection impurity and the collector, thereby reducing the resistance of the collector connection. The polysilicon 48 typically has a uniform doping level in the range of 1-3e20 $cm^{-3}$. This yields a collector connection resistance of well under 200 $\Omega \cdot \mu m$. Based on the sheet resistance of unsilicided N+ poly in a CMOS 140 nm technology of 100 $\Omega/sq$ for 0.18 $\mu m$ thick poly, it is expected that a minimum resistance of 20 $\Omega \cdot \mu m$ can be achieved for the collector connection.

Following the deposition of the polysilicon 48, the structure resulting from step (k) is planarized, preferably by chemical mechanical polishing (CMP) which removes the epitaxial base layer 40 from the surface of the resultant structure, followed by a nitride etch to remove the nitride layer 36. The resultant structure is shown in step (l).

The method proceeds to step (m) in which a poly-gate mask 50 is formed, which in this embodiment protects both the base-emitter stack formed in trench 38 and the collector sinker plug formed in trench 44. Alternatively, the poly-gate mask 50 may leave the collector connection formed in trench 44 uncovered, which will be discussed in more detail with the aid of FIG. 6.

After formation of the poly-gate mask 50, the exposed regions of the gate poly layer 34 and the gate oxide layer 32 are removed as shown in step (n). This may be achieved using any suitable etch recipe. Following base window patterning, the resist 50 is stripped off and standard CMOS spacers 52 are formed on the exposed sidewalls of the resultant structure as shown in step (o). Again, the formation of CMOS sidewall spacers 52 is well-known and will not be explained in further detail for the sake of brevity.

The HBT may now be finalized by the formation of silicide contact regions 54 on the exposed polysilicon, after which emitter contacts 60, base contacts 70 and collector contacts 80 may be formed in any suitable manner on the collector connection. The resultant HBT is shown in step (p).

Alternatively, as mentioned in the description of step (m) of FIG. 5, the poly-gate mask 50 may leave the collector connection formed in trench 44 uncovered. Consequently, during the patterning of the gate poly layer 34, some of the exposed polysilicon 48 in the collector sinker trench 44 is also removed, thereby reducing the thickness of the polysilicon 48 in the collector sinker trench 44 and reducing the overall resistance of the collector contact as a consequence. The resultant HBT is shown in FIG. 6, for which it will be clear that the resistance of the collector poly connection can reduced to below 20 $\Omega\cdot\mu m$.

Figure 7:
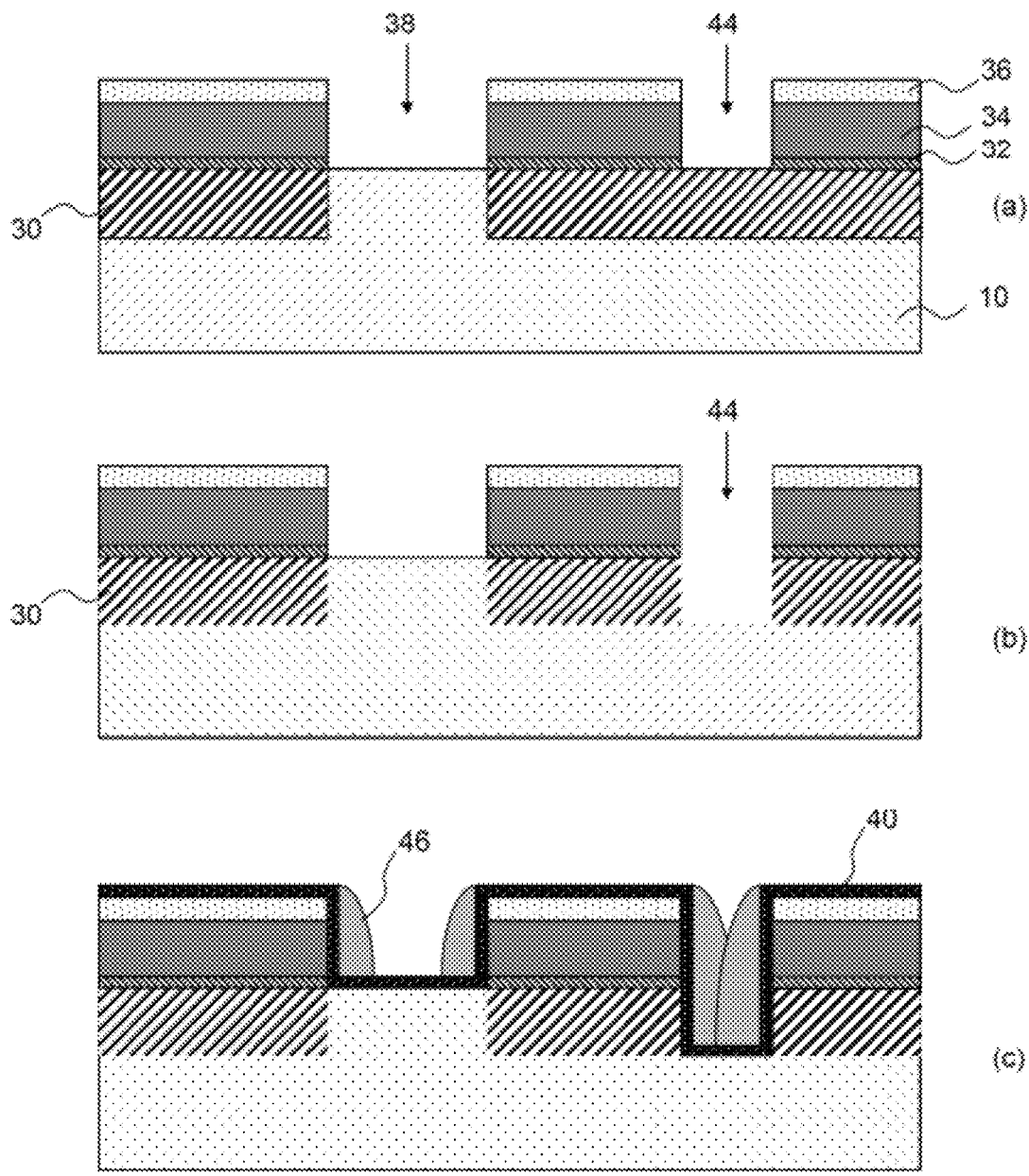
Figure 7:
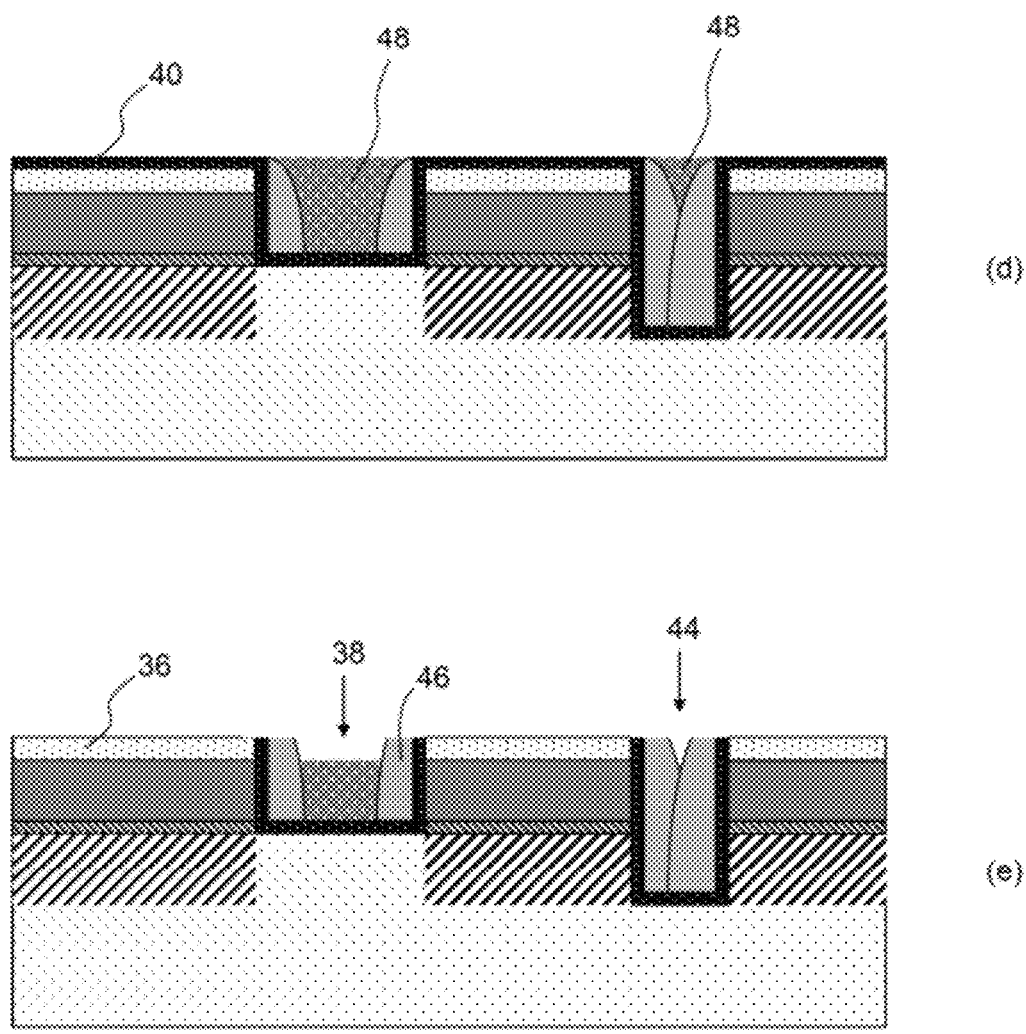
Figure 7:
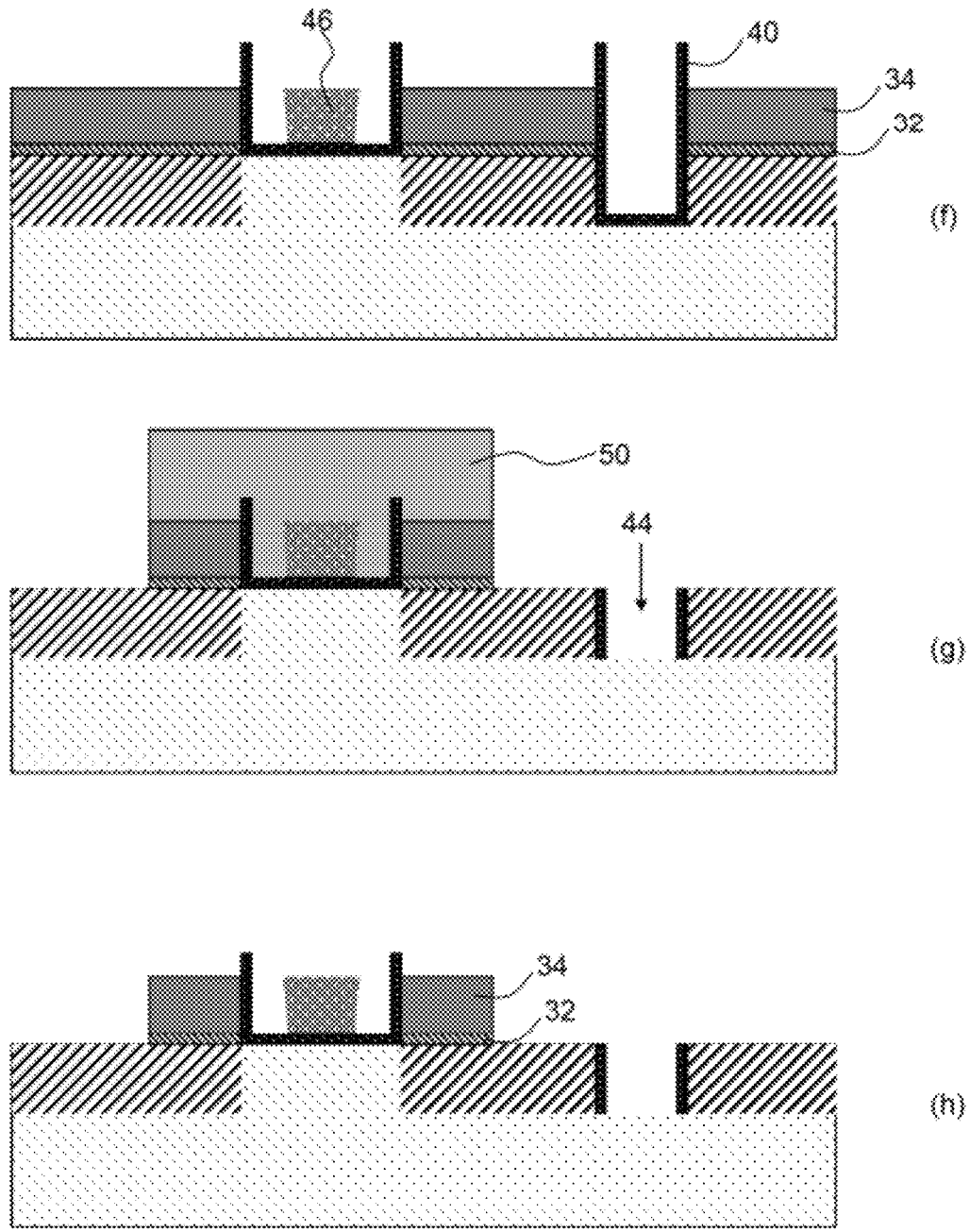
Figure 7:
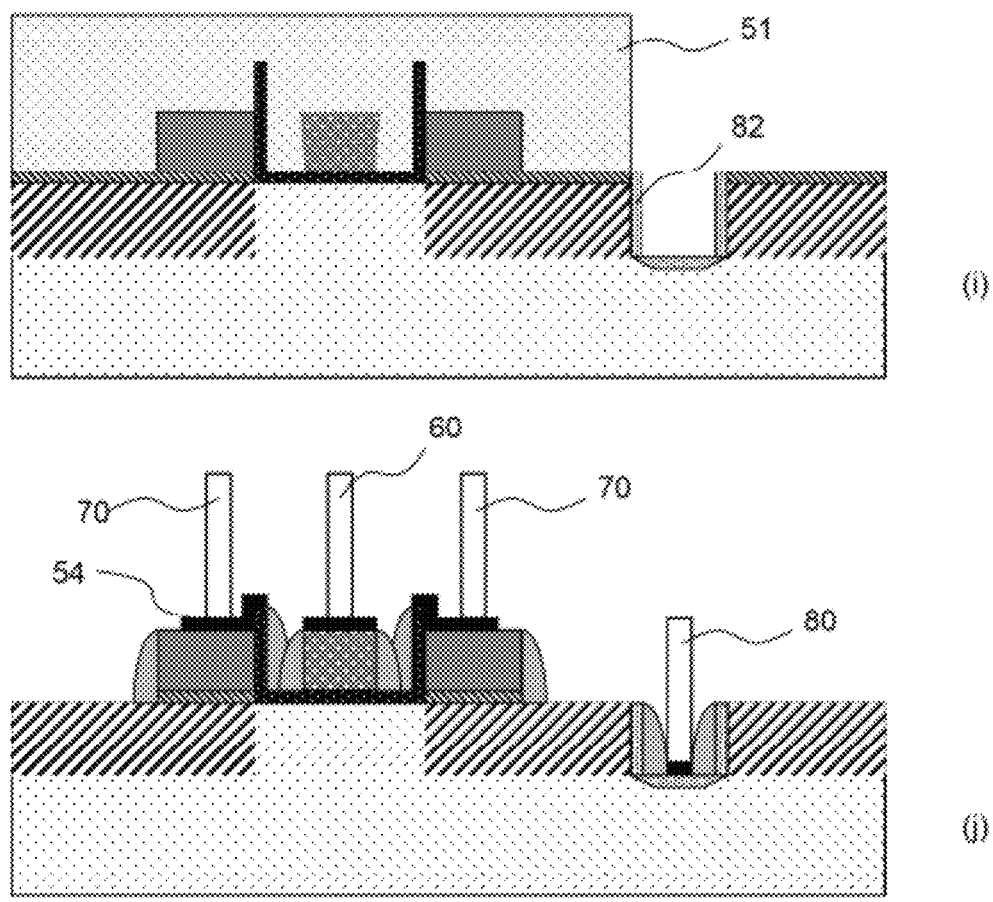

In the embodiments of FIG. 5 and FIG. 6, the collector sinker mask used in the prior art for implanting the collector connection in the further active region of the substrate 10 is reused for the (partial) formation of the trench 44. However, it is feasible to alter the process flow such that the collector sinker mask can be omitted altogether. An example of such an altered process flow is shown in FIG. 7. The embodiment of the method shown in FIG. 7 follows steps (a) and (b) as shown in FIG. 5. These steps are therefore not shown again for the sake of brevity. Following the deposition of the gate oxide 32, gate poly 34 and nitride protection layer 36, the base window 38 is etched simultaneously with the collector sinker trench 44 as shown in step (a) of FIG. 7. Hence, in the embodiment of FIG. 7, the base window mask is altered to allow for the simultaneous formation of both the base window 38 and the collector sinker trench 44. This may be achieved by a first etch step using the gate oxide layer 32 as an etch stop layer, followed by the removal of the gate oxide layer 32.

By using a selective oxide etch recipe, which is known per se and is therefore not explained in further detail for reasons of brevity, the STI region 30 underneath the trench 44 may be removed at the same time as removing the gate oxide layer 32, thereby exposing the substrate 10 underneath the trench 44 as shown in step (b). Analogous to the embodiment of FIG. 5, the method may now proceed by the epitaxial growth of the base layer 40 and the sidewall spacers 46, thus leading to the structure as shown in step (c). It is noted that the base layer 40 and the sidewall spacers 46 are also formed in the trench 44. The dimensions of the trench 44 are chosen such that the sidewall spacers 56 substantially fill the trench 44 as shown in step (c), and at least fully cover the substrate 10 at the bottom of the trench 44.

Next, the polysilicon emitter material 48 is deposited as shown in step (d), which not only fills the base window 38 but also fills the remaining portion of the trench 44. A planarization step, preferably a CMP step stopping on the nitride layer 36 and a subsequent polysilicon etch to remove the polysilicon portion 48 from the trench 44 are performed next, thus yielding the structure shown in step (e). It is noted that the polysilicon etch to remove the polysilicon portion 48 from the trench 44 causes the reduction of the thickness of the emitter poly in the base window 38. If this is undesirable, the base window 38 may be protected by a resist during the polysilicon etch.

The method proceeds with a nitride etch to remove the nitride layer 36 and a selective sidewall spacer etch to remove the sidewall spacers 46 from the trench 44. The consequence of the spacer etch is that the sidewall spacers 46 are also removed from the base window 38, as is shown in step (f). Poly gate mask 50 is subsequently formed over the poly gate region of the HBT to be formed, which is followed by the removal of the exposed regions of the gate poly layer 34, which incidentally also removes the epitaxial base layer 40 from the bottom of the trench 44, thereby exposing the substrate 10 at the bottom of the collector sinker trench 44, followed by the removal of the gate oxide layer 32. This may for instance be achieved by an anisotropic etch although alternatives will be apparent to the skilled person.

The resist 50 is subsequently stripped as shown in step (h) and an implant mask 51 is subsequently formed over the resultant structure leaving exposed at least the trench 44, after which an impurity 82 is implanted into the trench 44 as shown in step (i). In a preferred embodiment, the implant mask 51 is the Nplus mask as used in the formation of the MOS transistors of the IC, with the impurity 82 being an $N^+$ impurity. As the base layer sidewalls in the trench 44 typically already comprise a p-type impurity, e.g. boron, the p-type impurity is 'overwritten' or over-doped by the impurity 82.

The HBT may be finalized by the formation of silicide regions 54 and emitter contact 60, base contacts 70 and collector contacts 80 as shown in step (j). It is noted that in this embodiment the collector contact is formed at the bottom of the trench 44, i.e. has to reach a level equal to the depth of the STI 30. Generally, the overetch of the collector contact 80 is large enough to reach depths of 300-400 nm, which typically equals the depth of the STI 30.

Figure 8:
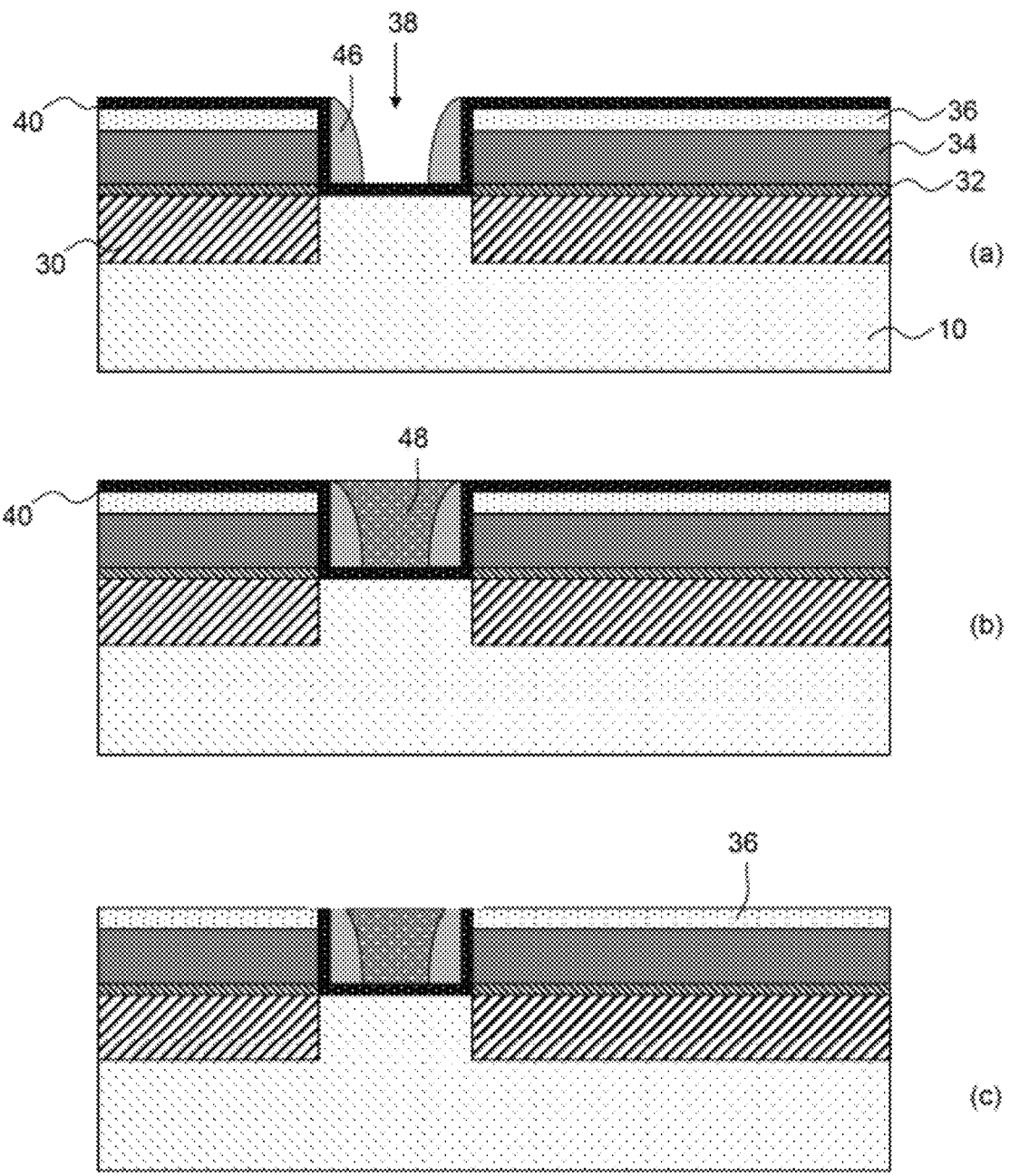
Figure 8:
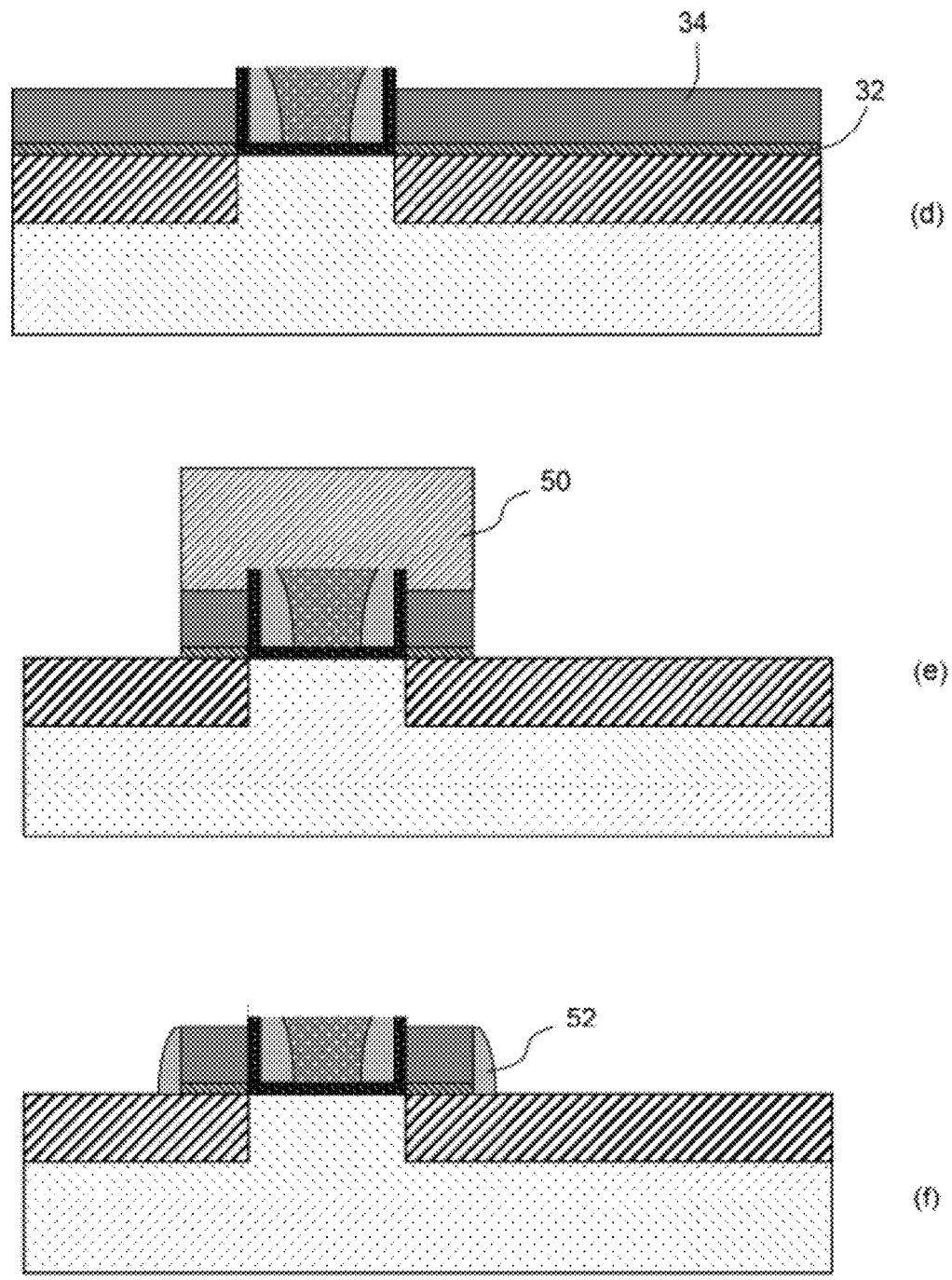
Figure 8:
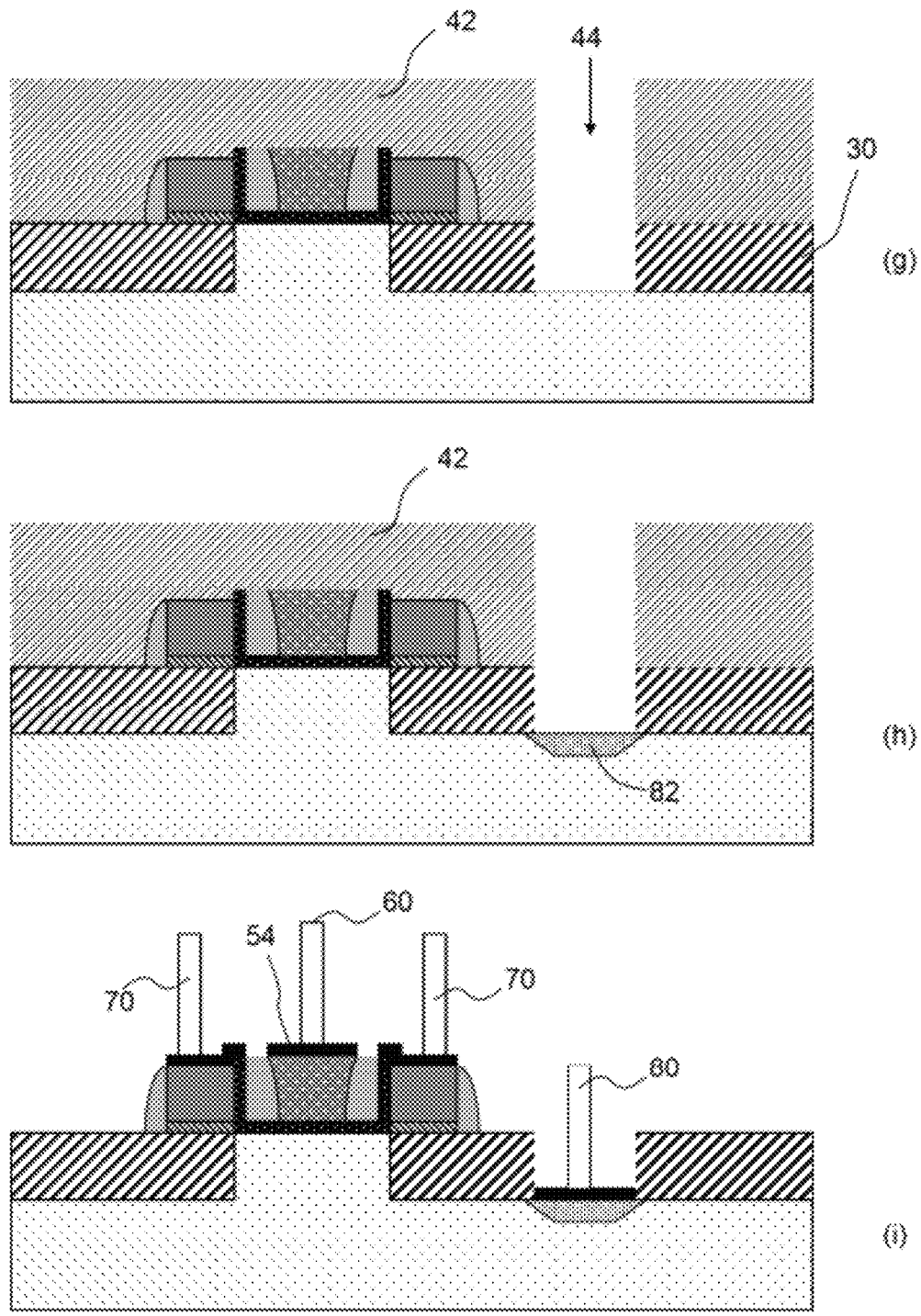

A further embodiment of the method of the present invention is shown with the aid of FIG. 8. The first steps of the embodiment of the method shown in FIG. 8 are identical to steps (a)-(d) of FIG. 5, which are therefore not explicitly shown in FIG. 8 for the sake of brevity. After the epitaxial growth of the base layer 40, which preferably is a SiGe:C layer as previously explained, the method proceeds with the formation of the sidewall spacers 46 in the base window 38, as shown in step (a), and the deposition of the emitter polysilicon 48 in the base window as shown in step (b). A planarization step, preferably a CMP step is performed stopping at the nitride layer 36 as shown in step (c), after which a nitride etch is applied to remove the nitride layer 36, thus yielding the structure shown in step (d). Next, the poly gate mask 50 is applied followed by the selective removal of the exposed gate poly layer 34 and the exposed gate oxide 32 as shown in step (e). At this point, the method may proceed with the growth of the CMOS sidewall spacers 52 as shown in step (f). It is noted that so far, the embodiment of the method of the present invention as shown in FIG. 8 has simply followed a conventional process flow for the formation of a HBT. However, after the formation of the CMOS sidewall spacers 52, the collector sinker mask is used for a novel purpose, i.e. to form the collector sinker trench 44 adjacent to the active region 20 (i.e. the transistor region) and separated there from by a portion of the STI 30, as also is the case in the previous embodiments of the HBT of the present invention. To this end, a resist 42 is applied to the resultant structure as shown in step (f), leaving exposed the region of the STI 30 in which the collector sinker trench 44 is to be formed, after which an oxide etch is applied to remove the STI 30 from the bottom of the trench and expose the substrate 10 as shown in step (g).

With the patterned resist 42 still present, an impurity 82 is subsequently implanted at the bottom of the trench 44, and subsequently developed. It is noted that the impurity 82 in both FIGS. 7 and 8 extends into the substrate 10 beyond the depth of the STI 30. In a preferred embodiment, the impurity 82 is implanted using the Nplus mask as discussed previously, in which case the impurity 82 is an N+ impurity. The resultant structure is shown in step (h). The resist 42 is subsequently stripped off and the HBT is finalized by the formation of silicide regions 54 and emitter contact 60, base contacts 70 and collector contacts 80 as shown in step (i).

As the HBTs formed by the embodiments of the method shown in FIG. 7 and FIG. 8 rely on an impurity implanted into the substrate 10 without requiring a conductive material in the trench 44, a particularly low-resistance collector connection is obtained as the collector connection resistance is negligible or even absent, and is instead dominated by the quality of the silicide to collector connection at the bottom of the trench 44.

It should be understood that although the present invention may be applied in the manufacture of purely bipolar transistor-based ICs, the present invention finds a particularly advantageous application in CMOS-based manufacturing processes where the IC contains a mixture of CMOS-based transistors and HBTs. In such mixed ICs, the MOS transistors may for instance be used for digital signal processing, with the HBTs used for high-frequency signal processing, e.g. analog signal processing.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A heterojunction bipolar transistor, comprising:
a substrate, an upper region of said substrate comprising an active region of the bipolar transistor bordered by shallow trench insulation, said active region comprising a buried collector region extending to a depth beyond the depth of the shallow trench insulation;
a trench adjacent to the active region and extending through the shallow trench insulation;
an outdiffusion of an impurity underneath said trench;
a base window region over said active region, said base window region including a base region and an emitter region separated from the collector region by the base region, said base region having a vertical portion electrically insulated from the emitter region by respective spacers; and
a collector contact coupled to the impurity underneath said trench, the collector contact extending through a portion of the shallow trench insulation.

2. The heterojunction bipolar transistor of claim 1, wherein said trench comprises side wall spacers and a polysilicon material comprising said impurity in between said side wall spacers.

3. The heterojunction bipolar transistor of claim 1, wherein the trench is lined with said impurity.

4. The heterojunction bipolar transistor of claim 3, further comprising side wall spacers on said lining.

5. The heterojunction bipolar transistor of claim 3, further comprising a collector contact mounted on the bottom of said trench.

* * * * *